United States Patent [19]
Tanaka

[11] Patent Number: 5,777,747
[45] Date of Patent: Jul. 7, 1998

[54] PROCESS FOR POSITIONING A MASK RELATIVE TO A WORKPIECE AND DEVICE FOR PERFORMING THE PROCESS

[75] Inventor: Yoneta Tanaka, Yokohama, Japan

[73] Assignee: Ushiodenki Kabushiki Kaisha, Tokyo, Japan

[21] Appl. No.: 564,005

[22] Filed: Nov. 29, 1995

[30] Foreign Application Priority Data

Nov. 29, 1994 [JP] Japan .................................. 6-294278
Nov. 29, 1994 [JP] Japan .................................. 6-294279

[51] Int. Cl.$^6$ .................................................. G01B 11/00
[52] U.S. Cl. ............................ 356/401; 356/399; 250/548
[58] Field of Search ............................ 356/399, 401; 250/548

[56] References Cited

U.S. PATENT DOCUMENTS 5,189,494   2/1993   Muraki ................................... 356/401

Primary Examiner—David C. Nelms
Assistant Examiner—Robert Kim
Attorney, Agent, or Firm—Sixbey, Friedman, Leedom & Ferguson; David S. Safran

[57] ABSTRACT

A process and apparatus for positioning a mask relative to a workpiece in which the relative positions of the alignment marks of the alignment mark of the mask and the workpiece can be easily recognized are achieved according to the invention by the fact that alignment light is emitted onto the mask alignment marks, projected images of the alignment marks of the mask are recorded by alignment units and undergo image processing, the relative positions are determined and stored, then emission of alignment light is stopped, alignment light is then emitted onto the alignment marks of the workpiece from the partial illumination systems, the alignment marks of the workpiece are recorded and undergo image processing, the relative positions thereof are determined and stored, data of the relative positions of the alignment marks of the mask and workpiece are computed, and relative movement of the workpiece and the mask is produced to position the two alignment marks one on top of the other.

4 Claims, 9 Drawing Sheets

PROCESS FOR POSITIONING A MASK RELATIVE TO A WORKPIECE AND DEVICE FOR PERFORMING THE PROCESS

BACKGROUND OF THE INVENTION

1. Field of the Invention

The invention relates to a process for positioning a mask relative to a workpiece and a device for performing the process in an exposure device which is used especially for production of a semiconductor device, a printed circuit board, an LCD (liquid crystal display) and for similar purposes. The invention relates especially to positioning of a mask relative to a workpiece in an exposure device of a projection exposure system, which can be done automatically and at the same time with high accuracy.

2. Description of Related Art

Production of electrical and electronic components and parts of various types in which processing of structures in the micron range is necessary includes an exposure process. These electronic parts are semiconductor components, liquid crystal displays, printer heads of the inkjet type, and multichip modules in which a host of different electronic components are produced on a substrate and thus a module is formed, and the like.

In this exposure process, a mask is used in which a pattern has been formed on a transparent substrate, such as glass or the like, by vapor deposition and etching of a metal, such as chromium or the like. Through this mask, a workpiece is irradiated with ultraviolet rays, and thus, the mask pattern is transferred to the photoresist applied to the workpiece.

These exposure systems are generally divided into a projection exposure system, a contact exposure system and a proximity exposure system. In the projection exposure system, a mask image is formed on the workpiece by means of a projection lens. In the contact exposure system, parallel light is emitted in a state in which the mask and the workpiece are located tightly against one another. In the proximity exposure system, the parallel light is emitted in a state in which a small intermediate space is formed between the mask and the workpiece.

In this exposure process, it is important, in the case of transmission of the mask pattern onto the workpiece, that a pattern to be subsequently transferred is positioned exactly relative to a pattern formed beforehand.

Figure 9:
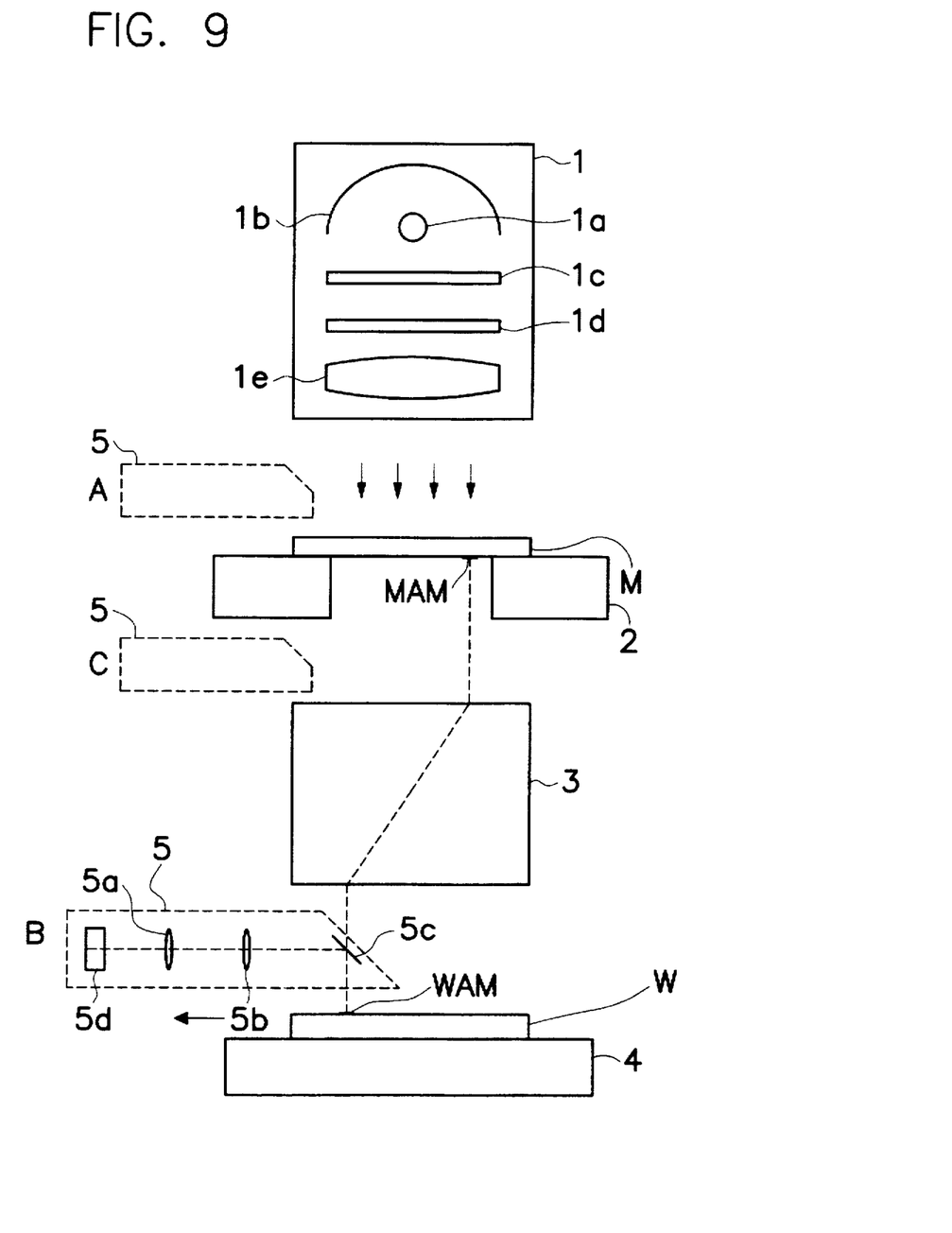
FIG. 9 is a schematic of a conventional arrangement.

FIG. 9 schematically shows an arrangement of a conventional exposure device of the projection type. In the drawing, a light irradiation device 1 has a lamp 1a, a focussing mirror 1b, a shutter 1c, an optical filter 1d and a condenser lens 1e.

Furthermore, a mask carrier 2 has a mask M that is attached thereon. A mask pattern and mask alignment marks MAM (hereafter, "mask marks") are recorded on mask M for purposes of positioning.

A projection lens 3 and a workpiece W are successively positioned below the mask. The workpiece W has workpiece alignment marks WAM (hereafter "workpiece marks") recorded thereon for purposes of positioning. Workpiece W is mounted on a workpiece carrier 4.

An alignment unit 5, which consists of a lens 5a, objective lens 5b, semitransparent mirror 5c and image converter 5d comprising a CCD camera. The workpiece mark WAM and mask mark MAM projected onto the workpiece W are detected via the semitransparent mirror 5c, objective lens 5b and the lens 5a by means of image converter 5d, and thus, the positions of the two marks are observed. Furthermore, the alignment unit 5 can be located, besides in area B as shown, also in an additionally shown area A or in an additionally shown area C.

In the drawing, when workpiece W is exposed, alignment light is emitted first from light irradiation device 1, and by means of alignment unit 5, the workpiece mark WAM and mask mark MAM projected onto workpiece W are detected (the method of determination of the mask alignment marks MAM projected onto the workpiece of this type by the projection lens is called TTL, i.e., the "through the lens" method).

In the case of auto alignment, by means of a control device which is not shown in the drawing, based on the features of the mask marks MAM and the workpiece marks WAM, the respective marks are recognized and mask carrier 2 and/or workpiece carrier 4 are automatically moved, such that the positions of the two marks agree with one another.

After completed positioning of the mask to the workpiece, exposure light is then emitted from light irradiation device 1, the mask pattern is projected onto workpiece W and exposure is effected.

In the above described positioning, by irradiation of the alignment marks located on the mask and the workpiece, respectively, with the alignment light their position ratios are recognized, and then, control is effected in order to obtain agreement. As the alignment light, here, either exposure light or nonexposure light is used. The term "exposure light" is defined as light which is used when the mask pattern is projected onto the workpiece and exposure is effected, and which has wavelengths at which the photosensitive agent applied to the workpiece, such as a photoresist or the like, has sensitivity. For this exposure light, for example an i-line, a h-line or a g-line (i-line: 365 nm wavelength, h-line: 405 nm wavelength, g-line: 436 nm wavelength) is used. On the other hand, the term "nonexposure light" is defined as light with wavelengths at which the photosensitive agent applied to the workpiece does not have sensitivity. For this, for example, an e-line, a d-line or a c-line (e-line: 546 nm wavelength, d-line: 588 nm wavelength, c-line: 656 nm wavelength) is used.

In the case of using exposure light as the alignment light in the area used for positioning, a circuit pattern cannot be formed, since in the course of positioning, the photoresist is exposed to the action of exposure light. This means that, in an area on workpiece W in which workpiece alignment marks WAM are recorded, a circuit pattern cannot be formed, and an area in which the circuit pattern can be formed is limited thereby. In the case in which the yield from a workpiece is to be a host of chips, as in semiconductor components, their number decreases according to the area used for positioning. Therefore the disadvantage arises that production efficiency is impaired.

On the other hand, in the case of using nonexposure light, the advantage arises that areas can be formed for the alignment marks in small gaps between the circuit pattern areas, and that the areas for the circuit patterns are not limited by the positioning area, since the photoresist is not exposed to the action of exposure light during positioning.

In this conventional positioning of the mask relative to the workpiece, the following disadvantages have arisen.

The alignment light is transmitted only according to the areas of the alignment marks located on the mask and emitted to the workpiece. If the irradiation surface on the workpiece with this transmission light is small, there are cases in which the workpiece marks are not irradiated with this transmission light and in which the image converter cannot determine the workpiece mark. As a result, auto alignment can no longer be done, in which the image converter determines both the workpiece mark and the mask mark, in which the control device recognizes them, and in which positioning of the mask to the workpiece is done on this basis.

In the case of manual alignment, the positions of the workpiece marks are assumed by the operator and the workpiece marks are determined by his manual movement of the workpiece carrier, and thus, the positioning of the mask relative to the workpiece can be done if the workpiece marks are not displayed on the monitor. However, in this case, it was regarded as disadvantageous that the actuation requires skill and that, at the same time, positioning takes a long time.

SUMMARY OF THE INVENTION

In view of the above described disadvantages of the prior art, a primary object of the present invention is to devise a process for positioning of a mask relative to a workpiece in which the relative positions of the mask marks and the workpiece marks can be easily recognized. Another object of the invention is to devise a device to execute the process.

The above described objects are achieved according to the invention by the fact that positioning is done by emitting from a first light irradiation part alignment light onto the alignment marks of a mask, by recording the projected images of the alignment marks of the mask and subjecting them to image processing, by determining/storing the relative positions, by subsequently stopping emission of the light from the first light irradiation part, by emitting alignment light from a second light irradiation part onto the workpiece alignment marks, by recording the workpiece alignment marks and subjecting them to image processing, by determining/storing the relative positions, by computing the data of the relative positions of the above described two alignment marks, and by moving the workpiece and/or the mask such that the above described two alignment marks come to rest on top of one another.

The objects are further achieved, according to the invention, by the fact that a positioning device has a mask, a mask carrier for executing movement of the above described mask, a projection lens, a workpiece, a workpiece carrier for executing movement of the above described workpiece, a first light irradiation part for irradiation of alignment marks of the mask with alignment light, a second light irradiation part for irradiation of alignment marks of the workpiece with alignment light, a camera means which records the projected images of the mask alignment marks by the alignment light emitted from the first light irradiation part, and records the workpiece alignment marks which are illuminated by the alignment light emitted from the second light irradiation part, and a control means which based on the video data recorded by the camera means controls the movement of the mask carrier and the workpiece carrier, that the control means records the mask alignment marks and undergoes image processing and determines/stores the relative positions thereof, if from the first light irradiation part, the exposure light is emitted, furthermore the control means records the workpiece alignment marks and undergoes. image processing and determines/stores the relative positions thereof, if the first light irradiation part stops emission of the exposure light and the second light irradiation part emits the alignment light, furthermore the control means computes the data of the relative positions of the two alignment marks and moves the workpiece and/or the mask such that the above described two alignment marks come to rest on top of one another.

The above described object is further achieved, according to the invention, by executing a process for positioning of a mask relative to a workpiece in which the exposure light is emitted as alignment light from a first light irradiation part onto the mask alignment marks, the mask alignment marks are projected and imaged onto a reflection component which is located in a workpiece carrier, the projected images are recorded and undergo image processing, the relative positions thereof are determined/stored, then emission of the exposure light from the first light irradiation part, as alignment light is stopped, a workpiece is placed on the workpiece carrier, and from the first light irradiation part or a second light irradiation part alignment light is emitted onto the workpiece alignment marks. Additionally, the workpiece alignment marks are recorded and undergo image processing, relative positions are determined/stored, the data of the relative positions of the two alignment marks are computed and the workpiece and/or the mask is/are moved such that the pair of alignment marks come to rest on top of one another.

The noted objects also achieved according to the invention by the fact that a mirror which is installed on one surface of the workpiece carrier is used as the reflection component which is located in the workpiece carrier.

Furthermore, the noted objects are also attainable by a mirror and an auxiliary imaging lens being used as the reflection part located on the workpiece carrier, being arranged such that, in one surface position of the workpiece placed on the workpiece carrier, projected images of the mask alignment marks are imaged.

The above described objects are also achieved according to the by the fact a device for positioning a mask to a workpiece has a mask, a mask carrier for executing movement of the mask, a projection lens, a workpiece, a workpiece carrier for executing movement of the workpiece, a first light irradiation part for irradiation of alignment marks of the mask with alignment light, a reflection component which is located on the workpiece carrier and in which projected images of the mask alignment marks are produced using exposure light as alignment light which is emitted from the first light irradiation part, a camera means which records the projected images of the mask alignment marks and records the workpiece alignment marks which are illuminated by the alignment light emitted from the first light irradiation part or a second light irradiation part, and a control means which, based on the video data recorded by the camera means, controls the movements of the mask carrier and the workpiece carrier, where the control means records the mask alignment marks projected onto the reflection component, undergoes image processing and determines/stores the relative positions thereof, if exposure light is emitted from the first light irradiation part as alignment light furthermore, the control means records the alignment marks of the workpiece placed on the workpiece carrier, undergoes image processing and determines/stores the relative positions thereof, and if the first light irradiation part stops emission of the exposure light as alignment light and the first light irradiation part emits nonexposure light as alignment light or the second light irradiation part emits the alignment light, the control means computes the data of the relative positions of the two alignment marks and moves the workpiece and/or the mask such that the two alignment marks come to rest on top of one another.

In conventional positioning, the relative positions of the two alignment marks were determined in a state in which the mask marks were projected onto the workpiece provided with the workpiece marks. Determination of the workpiece marks was therefore difficult in the case in which the surface on the workpiece irradiated by the transmission light which is transmitted only according to the areas of the alignment marks, as was described above, is small.

In the invention described, the workpiece marks can be determined regardless of the surface on the workpiece irradiated by the above described transmission light, and the mask can be easily positioned relative to the workpiece by means of the measure by which the alignment light from the first light irradiation part is separate by emitted in steps onto the mask marks, and the alignment light from the second light irradiation part is separate by emitted in steps onto the workpiece marks, by which the respective images are recorded separately, and by which, based on the respective recorded images, the position coordinates thereof are determined.

In the invention, the positions of the workpiece marks can be determined by means of the measure in which, the workpiece carrier has a reflection component in which the exposure light is emitted as alignment light onto the mask in a state in which the workpiece is not placed on the workpiece carrier, in which the positions of the projected images of the mask marks which are imaged by the reflection component are determined and stored, and in which, then, the workpiece is placed on the workpiece carrier and is irradiated with the alignment light.

By means of this process, the positions of the mask marks and the workpiece marks can, likewise, be recognized separately. Therefore, the workpiece marks can be determined regardless of the surface on the workpiece irradiated by the transmission light which is transmitted only according to the areas of the mask alignment marks, the relative positions of the mask marks and the workpiece marks can be determined, and the mask can be easily positioned to the workpiece.

Furthermore, as is described below, in the invention, exposure light which does not produce any imaging error or aberration, respectively, as it passes through the projection lens as alignment light can be used by the measure by which alignment light is emitted in a state in which the workpiece is not placed on the workpiece carrier. It goes without saying that the relative positions of the mask marks and the workpiece marks can be determined and the mask can be easily positioned relative to the workpiece without the mask marks being transmitted by the exposure light to the photosensitive agent on the workpiece, such as the photoresist or the like.

The above described action can easily be obtained by the addition of a simple arrangement to the conventional arrangement by the measure according to the invention in which a mirror installed on the surface of the workpiece carrier is used as a reflection part which is located on this workpiece carrier.

Furthermore, a mirror and an auxiliary imaging lens can also be used as the reflection component which is located on the workpiece carrier, instead of using the mirror installed on the surface of the workpiece carrier. In this case, the imaging positions of the projected images of the mask marks can be brought into agreement with the positions on the workpiece surface at a time at which the workpiece is later placed on the workpiece carrier. It, therefore, becomes possible, after completion of positioning of the mask relative to the workpiece, to transmit the mask pattern by exposure onto the workpiece without moving the workpiece carrier in the Z-axis direction.

These and further objects, features and advantages of the present invention will become apparent from the following description when taken in connection with the accompanying drawings which, for purposes of illustration only, show several embodiments in accordance with the present invention.

DETAILED DESCRIPTION OF THE PREFERRED EMBODIMENTS

Figure 1:
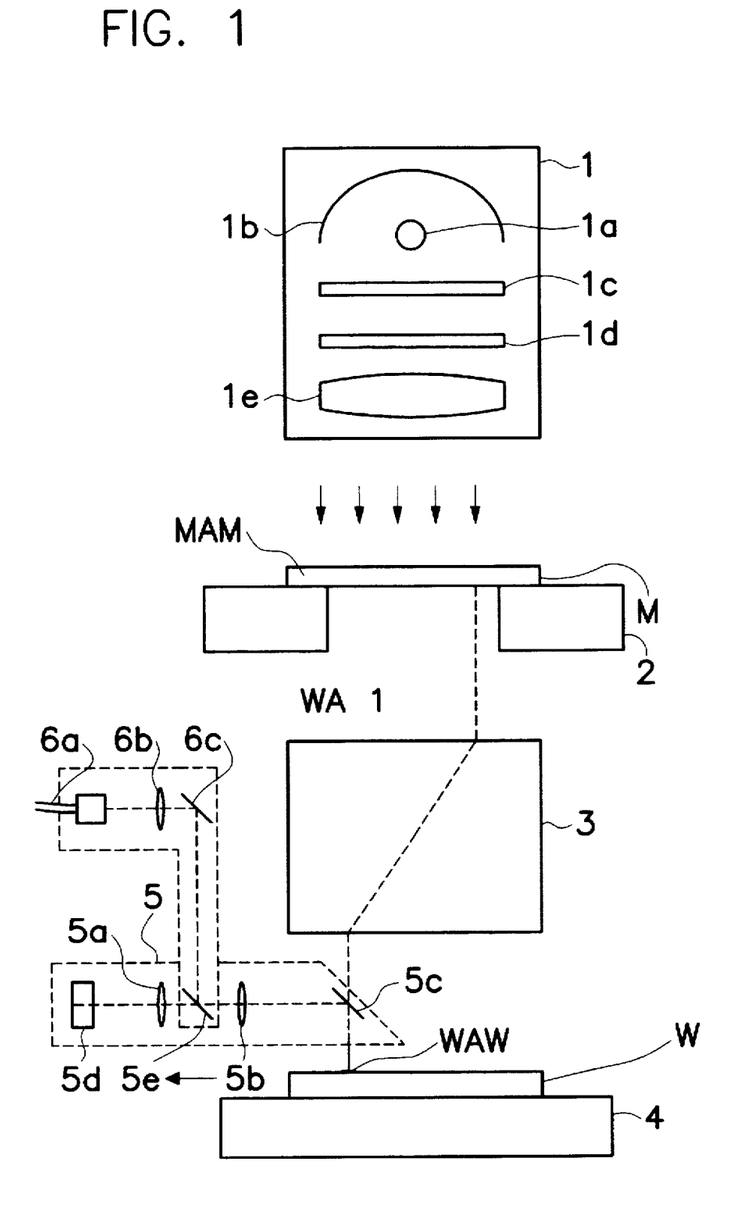
FIG. 1 shows a schematic of a first embodiment of the invention.

FIG. 1 is a schematic of a first embodiment of the invention.

In FIG. 1 parts of a first embodiment of the invention which are the same parts as parts in FIG. 9 are provided with the same reference numbers as in FIG. 9. Thus, a light irradiation device 1 has a lamp 1a, such as a high pressure mercury lamp or the like, which emits light which contains exposure light, a focussing mirror 1b, a shutter 1c, an optical filter 1d which is used in irradiation with the nonexposure light, and a condenser lens 1e.

Furthermore, mask carrier 2, which is driven in the X-Y-Z-θ directions by means of a drive device (not shown), carries a mask M on which a mask pattern to be transmitted in a conventional exposure process and mask alignment marks MAM are recorded for positioning of mask M relative to the workpiece W prior to performing the exposure process. A projection lens 3 is disposed below the mask. A workpiece W on which workpiece alignment marks WAM are recorded for purposes of positioning is positioned on a workpiece carrier 4 which is driven in the X-Y-Zθ directions by means of a drive device which is not shown.

A workpiece alignment mark partial illumination system is designated WA1. Nonexposure light from a light source (not shown) is incident on semitransparent mirror 5e of alignment unit 5 via optical fibers 6a, lens 6b and a mirror 6c, and irradiates the workpiece mark WAM on workpiece W via lens 5b and semitransparent mirror 5c.

The alignment unit 5 comprises lens 5a, objective lens 5b, semitransparent mirrors 5c and 5e and the image converter 5d which has the CCD camera. The mask mark MAM which is projected onto the workpiece W and the workpiece mark WAM irradiated by the workpiece alignment mark, partial illumination system WA1 are detected via semitransparent mirror 5c, objective lens 5b, semitransparent mirror 5e and lens 5a of image converter 5d. If, in this case, semitransparent mirror 5c has a certain thickness, deviation of the optical path of the alignment light of the mask, and thus, a change of the position in which mask mark MAM is determined occur. In this case, a corresponding correction is necessary.

Semitransparent mirror 5c ordinarily is formed of a resin film, for example, a pellicle with a thickness of roughly a few microns or the like. In this way, the above described influence of the thickness is reduced to the degree at which problems which are negligible with respect to use occur.

In the FIG. 1, only one alignment unit 5 and partial illumination system WA1 are each shown. However, there are several alignment units 5 (at least at two points), since on the mask M and workpiece W each have several mask marks MAM and several workpiece marks WAM (at least two points each), and since an alignment unit 5 is assigned to each alignment mark.

Alignment units 5 are, furthermore, ordinarily formed such that they can be removed in the direction of the arrow in the drawing. During exposure, the alignment units 5 are thus removed from their positions extending within an exposure area.

Figure 2:
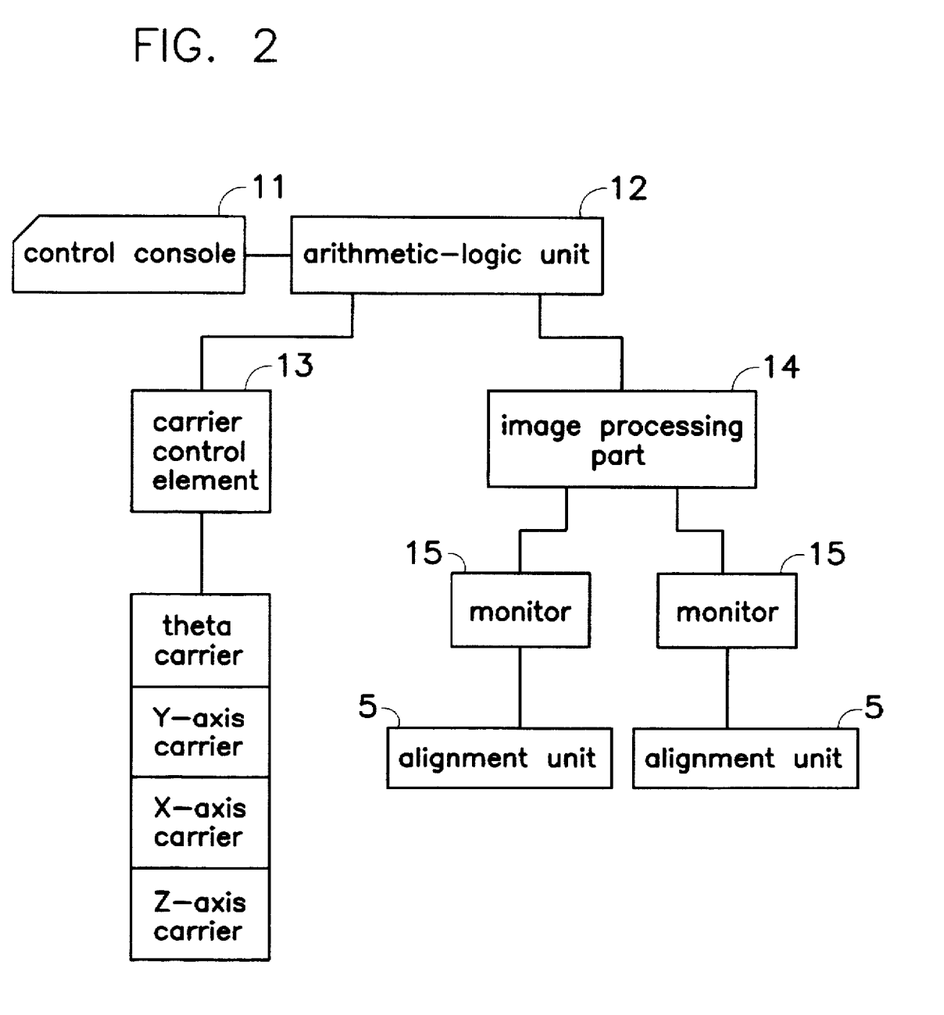
FIG. 2 shows a schematic of the system arrangement according to the embodiment according to the invention.

FIG. 2 is a schematic of a control system arrangement for the device shown in FIG. 1. In particular, a control console 11, an arithmetic-logic unit 12 for control of the projection exposure device and a carrier controlling element 13 which controls the positions of the mask carrier 2 and workpiece carrier 4 in the X-Y-Zθ directions.

An image processing part 14 which recognizes mask mark MAM recorded by means of image converter 5d of alignment unit 5, stores the position coordinates of the MAM, then recognizes workpiece mark WAM recorded by means of image converter 5d of alignment unit 5 and determines the position coordinates of the WAM, as is described below. Furthermore, arithmetic-logic unit 12 determines the difference between the position coordinates of mask mark MAM and the position coordinates of workpiece mark WAM which have been determined in image processing part 14. Carrier controlling element 13, then, moves the mask carrier 2 and/or workpiece carrier 4 so as to bring the two position coordinates into agreement with one another. The mask marks MAM and workpiece the marks WAM recorded by alignment units 5 are displayed on a monitor 15.

The following describes how exposure is performed:

(1) Workpiece W is placed on workpiece carrier 4 and by means of a vacuum chuck or the like attached to carrier 4. In this case, prealignment of workpiece W is done in order that workpiece mark WAM extends into the field of view of alignment unit 5 and thus positioning of workpiece W is accomplished with an accuracy of roughly 200 microns.

(2) Optical filter 1d with an e-line (546 nm wavelength) is inserted into light irradiation device 1. In this way, irradiation of mask M (of workpiece W) with the e-line as nonexposure light is enabled if shutter 1c is opened.

(3) Shutter 1c of light irradiation device 1 is opened. The nonexposure light is emitted onto mask M.

(4) The positions of mask carrier 2 and workpiece carrier 4 are shifted in the Z-direction in order to correct the imaging error of the nonexposure light and the exposure wavelengths.

This means that, in a projection lens which is designed such that no imaging error or aberration occurs at the exposure wavelengths, upon irradiation with the nonexposure light, due to the imaging error of the projection lens, a deviation of the mask pattern imaging surface occurs. The positions of the mask marks MAM on the mask pattern imaging surface by the nonexposure light and the positions of mask marks MAM on the mask pattern imaging surface by the exposure light therefore do not agree with one another.

It is therefore necessary, with consideration of the movement of focal depth and the principal planes of the projection lens by the wavelengths, to adjust the length of the optical path of the optical system, such that a magnification factor in the radiation of the nonexposure light is made equal to the magnification factor when the exposure light is radiated.

Therefore, mask carrier 2 and workpiece carrier 4 are moved with respect to projection lens 3, and thus, focal length correction is performed. Furthermore, there can be a device which moves projection lens 3 in the Z-axis direction, and thus, projection lens 3 and mask carrier 2 move, or projection lens 3 and workpiece carrier 4 move (reference is made to commonly assigned co-pending U.S. patent application Ser. No. 08/540,390, filed Oct. 6, 1995 for details of the above described focal length correction, said application being hereby incorporated by reference to the extent necessary to complete an understanding of this invention).

(5) The alignment unit 5 is inserted. Furthermore alignment mark partial illumination system WA1 is integrated with alignment unit 5 and so is inserted together with it.

(6) The mask mark MAM projected and imaged onto workpiece W is detected by means of the image converter 5d of the alignment unit 5 and sent to image processing part 14.

(7) Shutter 1c of light irradiation device 1 is closed. In this way, emission of nonexposure light onto mask M is stopped.

(8) Illumination light is routed into alignment mark partial illumination system WA1. This means that a shutter of a light source not shown in the drawing is opened for purposes of partial illumination, workpiece mark WAM on workpiece W being irradiated via the optical fibers 6a, lens 6b, mirror 6c, semitransparent mirror 5e, lens 5b, and the semitransparent mirror 5c, and then is recorded by means of image converter 5d.

The image of the workpiece mark WAM recorded by the image converter 5d is sent to image processing part 14, which identifies workpiece mark WAM and determines its position coordinates (XW, YW).

(9) Arithmetic-logic unit 12 determines the position deviation of workpiece W and mask M based on the stored position coordinates (XM, YM) of mask mark MAM and determined position coordinates Q(W, YW) of the workpiece mark.

The carrier controlling element 13 drives mask carrier 2 and/or workpiece carrier 4 in the X-Yθ directions to bring the position of mask mark MAM into agreement with the position of workpiece mark WAM based upon the above described position deviation.

(10) The positions of mask carrier 2 and workpiece carrier 4 in the Z-direction, which were corrected in above described step (4), are moved back into the normal exposure position. In this way, the projected image of the mask pattern on mask M is imaged by the exposure light onto workpiece W.

(11) Optical filter 1d of light irradiation device 1 is switched such that the exposure light is emitted onto mask M, shutter 1c is opened, and thus, exposure is performed.

As is described above, in this embodiment, the positions of the workpiece marks WAM can also be reliably determined and positioning can be achieved within a short time with high accuracy by the measure by which first the nonexposure light is emitted as alignment light, mask marks MAM are projected onto workpiece W and the position coordinates of the mask marks MAM are stored, and by which, then, emission of the above described nonexposure light is stopped, by partial illumination, the vicinity of workpiece marks WAM is irradiated and the position coordinates of the workpiece marks are determined; when a mask is used with which, in the conventional process, light is transmitted to an area that is based on the size of the mask marks MAM, the area on the workpiece irradiated by the transmission light becomes small.

This embodiment also has the following effects:

In the conventional TTL process, the positioning of the mask relative to the workpiece was done by recording the mask marks and the workpiece marks at the same time, based on the feature of the respective mark, by recognizing the above described respective mark and by determining the relative positions thereof. If the mask marks and the workpiece marks do not come to rest on top of one another and are completely separated from one another, there is, therefore, no problem since by means of the control device the overall shape of the mask can be exactly acquired and the feature of the respective mark can be evaluated.

In the case in which the mask marks and the workpiece marks come to lie only partially on top of one another, however, the control device was not able to recognize the features of the workpiece marks in spite of the presence of the mask marks and workpiece marks within the determination area. This means that, in the case in which the workpiece marks are, for example, cross-shaped, the control device cannot recognize them as a cross shape, if in some of these workpiece marks and mask marks come to rest on top of one another, since the workpiece marks in general have a lower contrast than the mask marks. Consequently, the workpiece marks cannot be recognized.

This problem, furthermore, occurs also in the case in which the mask pattern is located entirely in the vicinity of the mask marks. If, specifically, the mask pattern in the vicinity of the mask marks is projected onto the workpiece marks, the features of the workpiece marks cannot be evaluated, even if the mask marks and the workpiece marks are separated from one another. Therefore, the problem occurred that, in the peripheral areas of the mask marks, a limitation of the mask construction occurred and that the user's needs could not be satisfied.

In accordance with the invention, however, the workpiece marks can be exactly evaluated by the measure wherein, from the first light irradiation part, the alignment light is emitted onto the mask marks, wherein the mask marks are projected and imaged onto workpiece W and the position coordinates of the mask marks are stored, wherein, subsequently, emission of the above described alignment light is stopped, wherein by the second light irradiation part, the vicinity of the workpiece marks is irradiated, and wherein, the position coordinates of workpiece marks WAM are thus determined, even in the case in which the mask marks and the workpiece marks come to rest on top of one another or in which the mask pattern is positioned in the vicinity of the mask marks. Consequently, according to the invention, positioning can be achieved in a short time and with high accuracy. Exact evaluation of mask marks is, here, also possible in the case in which the mask marks and the workpiece marks come to rest partially on top of one another, since the mask marks have higher contrast than the workpiece marks as was described above.

In the above described embodiment, the position coordinates of the mask marks are determined, stored and then the position coordinates of the workpiece marks are determined. However, the same action can also be obtained by first determining and storing the position coordinates of the workpiece marks, and then determining the position coordinates of the mask marks.

Figure 3:
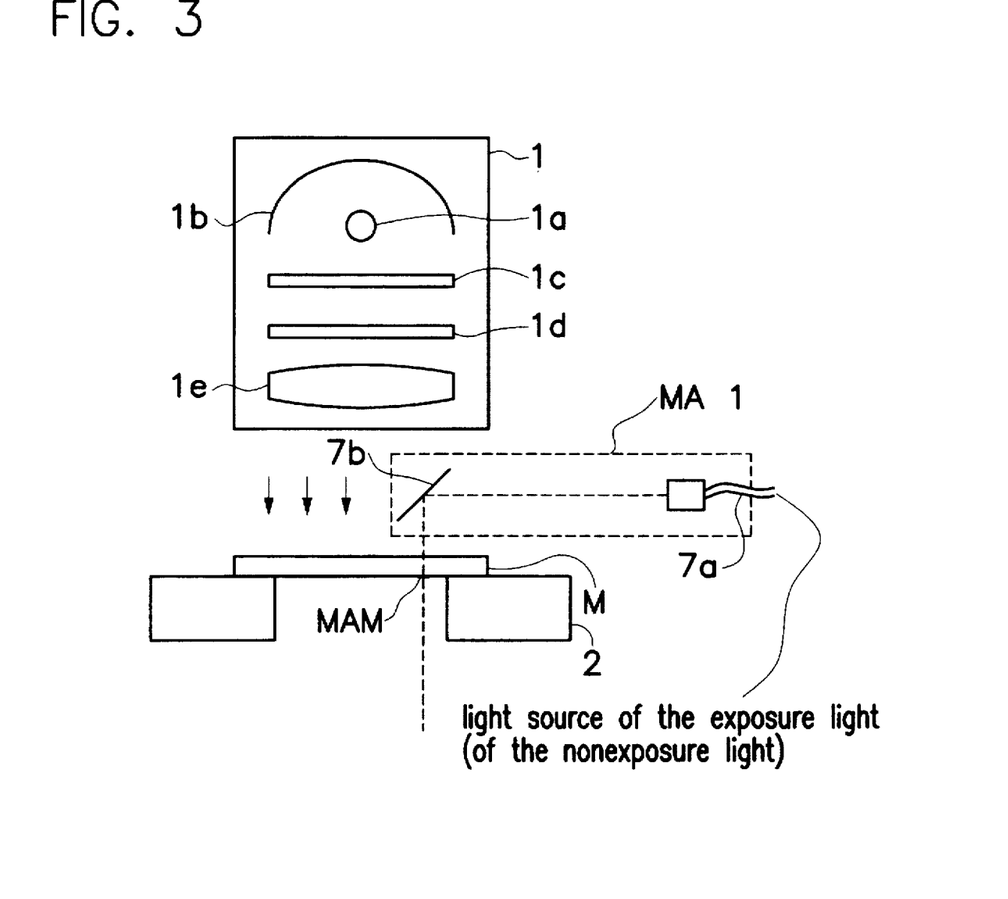
FIG. 3 is a schematic representation of a second embodiment of the invention.

In the following, a second embodiment according to the invention is described with reference to FIG. 3.

In this embodiment, there is a mask alignment mark partial illumination system MA1 which is comprised of optical fibers 7a and mirror 7b, and which partially illuminates the peripheral area of mask mark MAM during alignment. The remainder of this arrangement is identical to the first embodiment shown in FIG. 1.

In the first embodiment, the nonexposure light is emitted from light irradiation device 1 when mask marks MAM are imaged on workpiece W in order to position mask marks MAM relative to workpiece marks WAM (see steps (2) and (3) according to the first embodiment). In the second embodiment, mask mark MAM is imaged onto workpiece W by partially illuminating the peripheral area of mask mark MAM by the above described mask alignment mark partial illumination system MA1. Other process steps for positioning are identical to the above described first embodiment.

In this embodiment, in the case of emission of the nonexposure light from the mask alignment mark partial illumination system MA1, it is necessary to shift the positions of mask carrier 2 and workpiece carrier 4 in the Z-direction, in order to correct the imaging errors of the nonexposure light and the exposure wavelengths as in step (4) according to the above described first embodiment. However, in the case in which the exposure light is emitted from the above described partial illumination system MA1, it is not necessary to move mask carrier 2 and workpiece carrier 4 in the Z-direction, as in step (4) according to the first embodiment.

In the case of emission of exposure light from the partial illumination system MA1, the pattern cannot, however, be located in the vicinity of the alignment mark which may be irradiated by the exposure light, since the exposure light irradiates not only mask mark MAM (workplace mark WAM), but also the peripheral area thereof.

As described above, in this embodiment, mask marks MAM can be imaged on workpiece W by the arrangement of mask alignment mark partial illumination system MA1, not only by the nonexposure light, but by the exposure light. In this way, activation to correct the imaging error of the nonexposure light and the exposure wavelength is no longer necessary. Furthermore, an application for a projection lens is enabled which has the characteristic that no focussing can be done by the nonexposure light. In this way, positioning of the mask marks relative to the workpiece marks is enabled without taking into account the characteristic of the projection lens.

In this case, the expression "alignment light" is defined as the light, including the exposure light and the nonexposure light, which is used for purposes of positioning of the mask marks relative to the workpiece marks.

Figure 4:
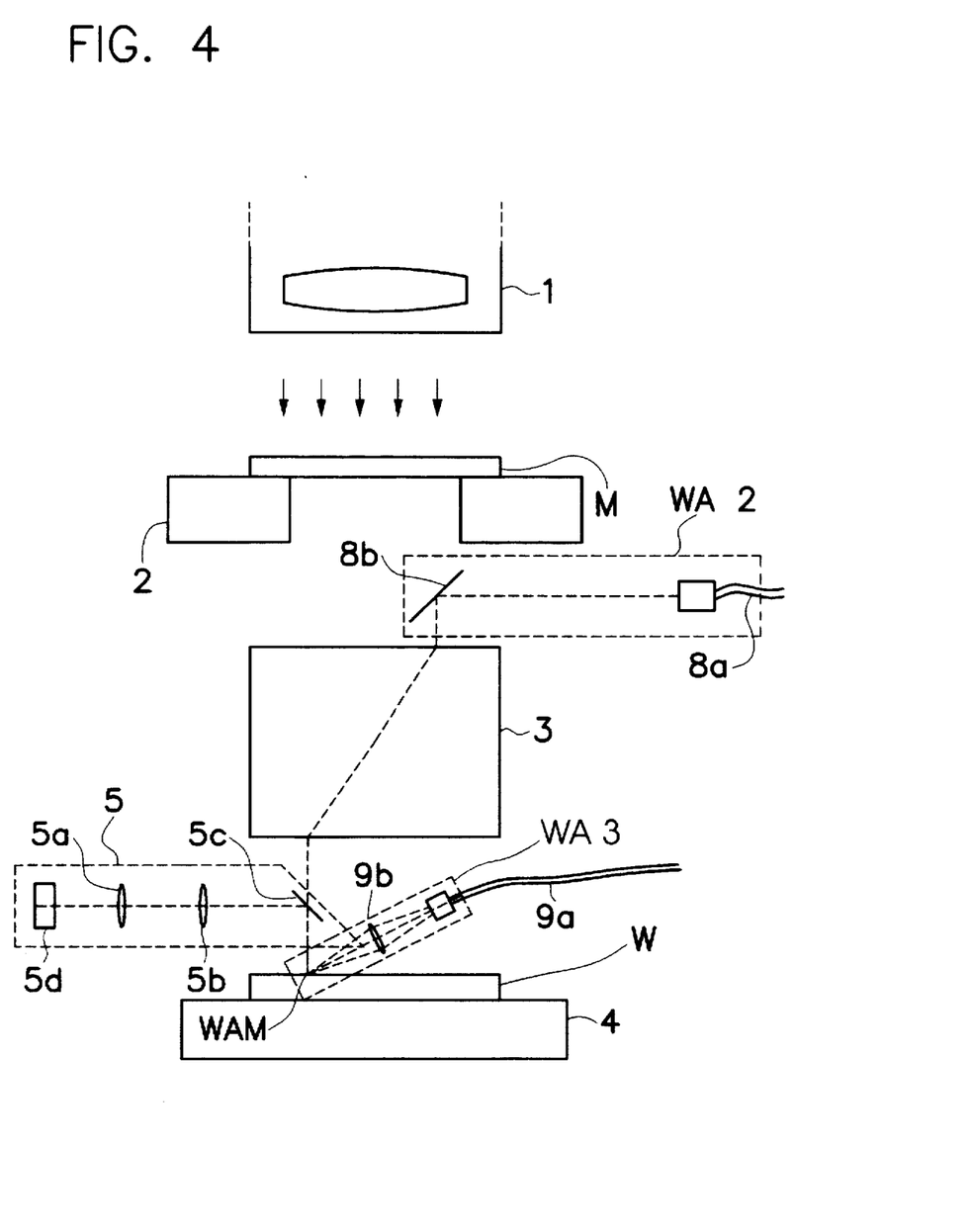
FIG. 4 is a schematic of a third embodiment and a fourth embodiment of the invention.

FIG. 4 is a schematic of third and fourth embodiments of the invention. In the third embodiment of the invention, instead of the workpiece alignment mark partial illumination system WA1 according to the first embodiment, there is a workpiece alignment mark partial illumination system WA2. In the fourth embodiment of the invention, instead of workpiece alignment mark partial illumination system WA1 according to the first embodiment, there is workpiece alignment mark partial illumination system WA3. The remaining arrangement is identical to the first embodiment shown in FIG. 1.

In the third embodiment of the invention, as is described above, there is workpiece alignment mark partial illumination system WA2. The workpiece alignment mark partial illumination system WA2 is inserted when photographing workpiece mark WAM by means of image converter 5d (step (8) according to the first embodiment). In this case, the nonexposure light is supplied via optical fibers 8a and irradiates workpiece mark WAM on the workpiece W via mirror 8b, projection lens 3 and the semitransparent mirror 5c. The other process steps are identical to the first embodiment.

In the fourth embodiment of the invention, as is described above, there is workpiece alignment mark partial illumination system WA3. The workpiece alignment mark partial illumination system WA3 is inserted when photographing workpiece mark WAM by means of image converter 5d (step (8) according to the first embodiment). In this case, the nonexposure light is supplied via optical fibers 9a and irradiates workpiece mark WAM on the workpiece W via lens 9b. The other process steps are identical to the first embodiment.

In the third and fourth embodiments of the invention, the positions of workpiece marks WAM can be reliably recognized and positioning can be achieved in a short time with high precision, as in the first embodiment, by the measure wherein the mask marks MAM are projected onto workpiece W, the position coordinates of mask marks MAM are stored, subsequently the vicinity of workpiece marks WAM is irradiated by the partial illumination system WA2, or the partial illumination system WA3, and thus, the position coordinates of workpiece marks WAM are determined.

In the case in which alignment unit 5 and partial illumination system WA1 are integral with one another, as in the first embodiment, it is not necessary to adjust the position between the two. If, however, alignment unit 5 and partial illumination systems WA2 and WA3 are arranged as separate individual parts, as in the above described third and fourth embodiments, it is necessary to adjust their position relative to one another.

In the above described first through fourth embodiments, nonexposure light is emitted from workpiece alignment mark partial illumination system WA1, WA2, or WA3. In the case wherein there is no pattern in the peripheral areas of the workpiece marks, exposure light can, likewise, be emitted.

Furthermore, the above described third and fourth embodiments can be applied to the second embodiment, and the nonexposure light or exposure light can be emitted from mask alignment mark partial illumination system MA1.

Furthermore, in the first through fourth embodiments, there are alignment units 5 additionally in the area shown in FIG. 1, and also in area A or area C, as was shown in the above described conventional example using FIG. 9.

In the following, the invention is described according to the embodiment of FIG. 5. Those parts that are the same as parts shown in FIGS. 1 and 9 are provided with the same reference numbers as in FIGS. 1 and 9.

A total reflection or semitransparent mirror 4a is installed on workpiece carrier 4. It is desirable that above mirror 4a a semitransparent mirror.

Mask mark MAM is imaged in mirror 4a located in workpiece carrier 4, and the workpiece mark WAM is irradiated by the above described workpiece alignment mark partial illumination system WA1. In alignment unit 5 they are both recorded via the semitransparent mirror 5c, the objective lens 5b, the semitransparent 5e and the lens 5a by means of the image converter 5d.

Semitransparent mirror 5c consists, as was described above, of a resin film, for example a pellicle with a thickness of roughly a few microns or the like. Alignment unit 5 and partial illumination system WA1 are, furthermore, located at least at two points according to the number of mask marks and workpiece marks. This embodiment, furthermore, has the same system arrangement as in FIG. 2.

In the following, exposure using this embodiment is described.

(1) Mask M is placed on mask carrier 2 and attached. Shutter 1c of light irradiation device 1 is opened. Exposure light is emitted onto mask M as alignment light. In this process step, workpiece W is not placed on workpiece carrier 4.

(2) The position of workpiece carrier 4 is shifted in the Z-direction, such that the reflection surface of mirror 4a installed in workpiece carrier 4 agrees with the imaging surface Zo of the mask pattern produced by the exposure light.

(3) Alignment unit 5 is inserted. Workpiece alignment mark partial illumination system WA1 is arranged integrally with alignment unit 5 and is inserted together with alignment unit 5 into the imaging path.

(4) By means of image converter 5d of. alignment unit 5, mask mark MAM projected onto mirror 4a of workpiece carrier 4 is recorded and sent to image processing part 14. Based on the recorded image, image processing part 14 identifies the mask mark MAM and stores the position coordinates thereof (XM, YM).

There are, generally, a host of cases in which the light intensity of the projected image on mirror 4a of the imaging position of mask mark MAM is greater than the light intensity in an area in which image converter 5d can effectively record the image. When a total reflection mirror is used as the above described mirror 4a, there are cases in which, in the image converter 5d, in the recorded image of mask mark MAM, problems occur, such as halo formation and the like, and recognition of the alignment mark becomes difficult. It is, therefore, desirable to use a semitransparent mirror for the above described mirror 4a, and to reduce the light intensity of the projected image of the mask mark MAM in mirror 4a.

(5) Shutter 1c of light irradiation device 1 is closed. In this way, emission of exposure light onto mask M is stopped.

(6) Workpiece W is placed on workpiece carrier 4 and attached. In doing so, pre-alignment of the workpiece W is performed in order that workpiece mark WAM extends into the field of view of the alignment unit 5, and thus, positioning of the workpiece W is accomplished with an accuracy of roughly 200 microns.

(7) Workpiece carrier 4 is moved in the Z-axis direction, such that the surface of the workpiece W agrees with the imaging surface Zo of the mask pattern.

(8) The illumination light is supplied to workpiece alignment mark partial illumination system WA1. This means that a shutter of a light source (not shown) is opened for purposes of partial illumination, and workpiece mark WAM on workpiece W is illuminated and recorded by means of image converter 5d via optical fibers 6a, lens 6b, mirror 6c, semitransparent mirror 5e, lens 5b and semitransparent mirror 5c.

The image of the workpiece mark WAM recorded by means of the image converter 5d is sent to the image processing unit 14 which identifies workpiece mark WAM and determines its position coordinates (XW, YW).

Furthermore, instead of the arrangement of the above-described workpiece alignment mark partial illumination system WA1, optical filter 1d can also be inserted into the light irradiation device 1 and the entire surface of workpiece W can be irradiated by nonexposure light emitted from light irradiation device 1.

In this case, the mask patten is projected onto workpiece W. If, however, the workpiece carrier 4 is located in position Zo in the drawing, the mask pattern is not imaged onto workpiece W since, conventionally, as the result of the imaging error of projection lens 3, the focal position of the mask pattern due to the exposure light differs from the focal position of the mask pattern by the nonexposure light. In this case, workpiece mark WAM and mask mark MAM are not shown due to the fact that they come to rest on top of one another.

(9) Arithmetic-logic unit 12 determines the position deviation of workpiece W and mask M based on stored position coordinates (XM, YM) of mask mark MAM and determined position coordinates (XW, YW) of the workpiece mark.

Carrier controlling element 13, due to the above described position deviation, drives mask carrier 2 and/or workpiece carrier 4 in the X-Y-θ directions and brings the position of mask mark MAM into agreement with the position of workpiece mark WAM.

(10) Shutter 1c of light irradiation device 1 is opened, the exposure light is emitted onto mask M, and thus, exposure is performed. Furthermore, in the case in which the alignment unit 5 extends into the exposure area, alignment unit 5 is first removed before exposure is conducted, as was described above.

As also is described above, in this embodiment, in a state in which workpiece W is not placed on workpiece carrier 4, 1) the reflection surface of mirror 4a of workpiece carrier 4 is brought into agreement with the imaging surface Zo of the mask pattern, the exposure light is emitted, mask mark MAM is projected onto mirror 4a and the position coordinates of mask mark MAM are stored, and 2) subsequently, emission of the above described exposure light is stopped, workpiece W is placed on workpiece carrier 4, the surface of the workpiece W is brought into agreement with imaging surface Zo of the mask pattern, workpiece mark WAM is irradiated by the nonexposure light and the position coordinates of workpiece mark WAM are determined.

This means that the measure by which the positions of mask marks MAM and the positions of workpiece marks WAM are determined separately prevents identification of the workpiece marks from becoming difficult when using a mask, wherein, by the conventional process, the surface of workpiece W which is irradiated by the transmission light which is transmitted only according to the size of mask marks MAM becomes small. In this way, the relative positions of the mask marks and the workpiece marks can be easily determined, and therefore, auto alignment positioning can be performed within a short time with high accuracy.

In accordance with another embodiment of the invention, however, the following action is obtained:

In the case of using the nonexposure light as the alignment light, for example, the e-line, positioning is impossible without correction of the imaging error for a projection lens which is designed so that no imaging error occurs at the exposure wavelengths, since, in this case, at the nonexposure wavelengths, imaging errors occur and the imaging positions and the sensitivity factors of the mask marks are different.

However, in accordance with another aspect of the invention, the exposure light can be used as alignment light.

Therefore, regardless of the characteristic of the projection lens, positioning of the mask relative to the workpiece can be performed with high accuracy.

In the above described embodiment, an example was shown in which mirror 4a is located roughly over the entire surface of the workpiece carrier. However, mirror 4a can, likewise, be placed only in one area onto which mask mark MAM is projected.

Figure 6:
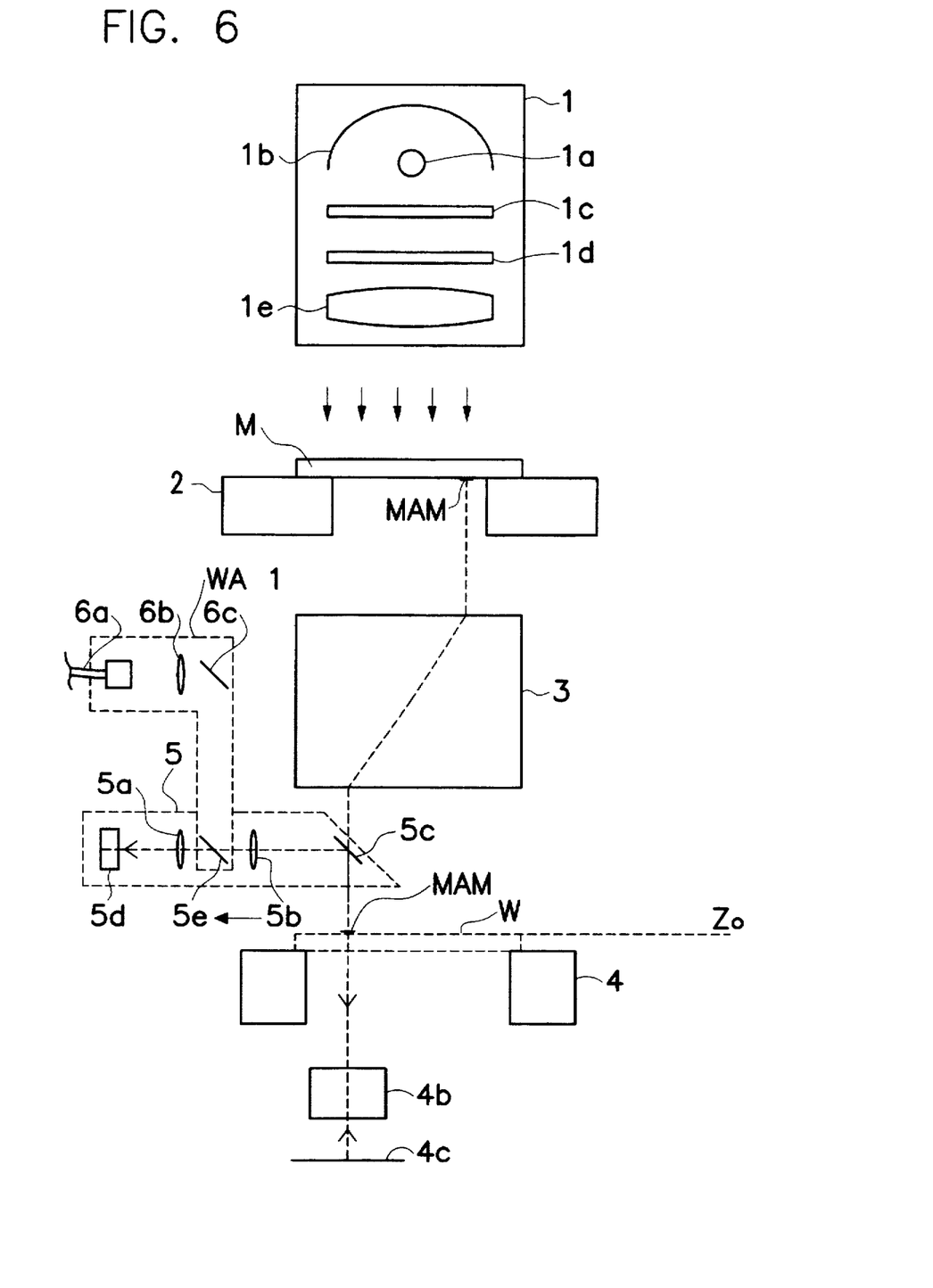
FIG. 6 is a schematic of a further embodiment of the invention.
Figure 7:
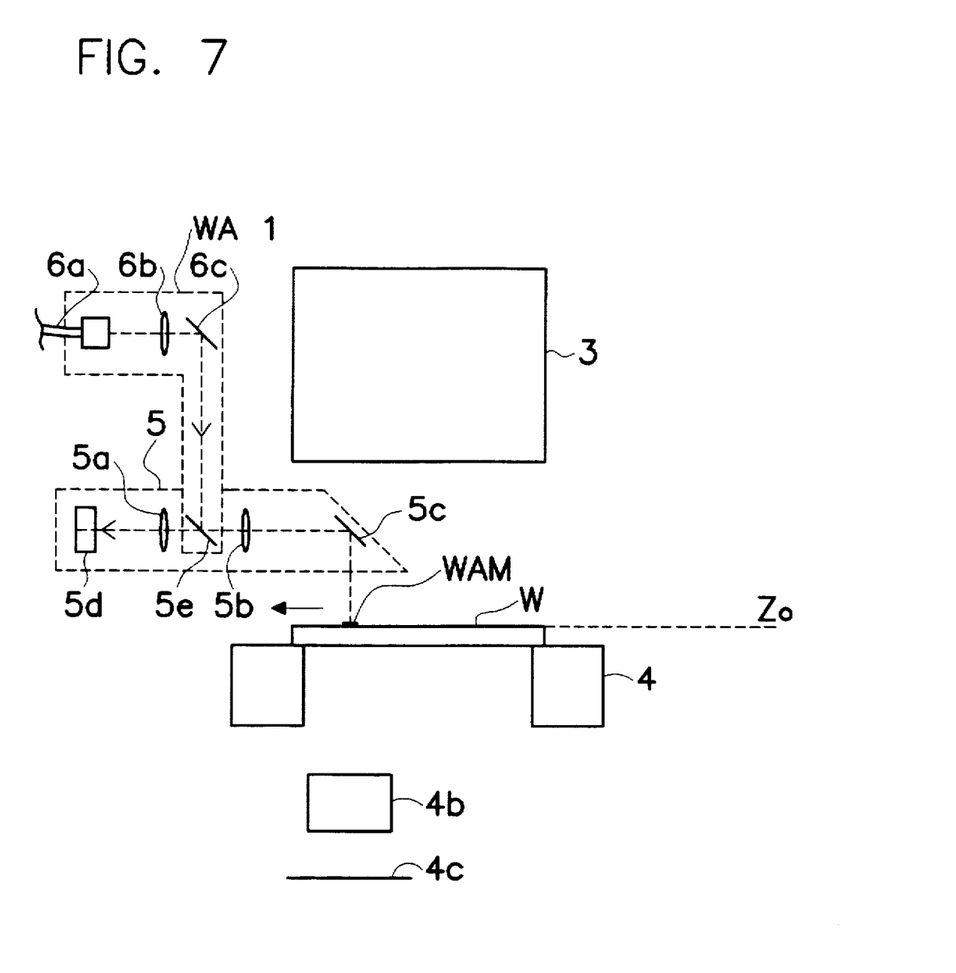
FIG. 7 shows a schematic representation of the FIG. 6 embodiment of the invention at a later stage of processing.

FIGS. 6 and 7 schematically show a further embodiment of the invention where, instead of installing mirror 4a in workpiece carrier 4, an auxiliary imaging lens 4b and mirror 4c are disposed under the workpiece carrier 4. The projected image of mask mark MAM is reflected by means of above described mirror 4c and is imaged by means of auxiliary imaging lens 4b on imaging surface Zo of the mask pattern. The remaining arrangement is identical to the first embodiment. Furthermore, it is desirable that, for above described mirror 4c, a semitransparent mirror be used, as was described above. Mirror 4c can, furthermore, be located also roughly over the entire area under the workpiece carrier 4 or also located only in an area on which mask mark MAM is projected.

In the following, the exposure process in this embodiment is described.

(1) Mask M is placed on mask carrier 2 and attached. Shutter 1c of the light irradiation device 1 is opened and the exposure light is emitted onto the mask M. In this process step, workpiece W is not placed on the workpiece carrier 4, as is shown in FIG. 6. The position of workpiece carrier 4 in the Z direction is fixed, such that the surface of the workpiece agrees with the imaging surface Zo of the mask pattern when workpiece W is put in place.

(2) The position of the auxiliary imaging lens 4b is adjusted in order that the projected image of mask mark MAM is imaged on imaging surface Zo of the mask pattern.

(3) Alignment unit 5 is inserted.

(4) By means of image converter 5d of alignment unit 5, the mask mark MAM projected onto imaging surface Zo of the mask pattern of workpiece carrier 4 is recorded and sent to image processing part 14. Based on the recorded image, image processing part 14 identifies mask mark MAM and stores the position coordinates thereof (XM, YM).

(5) Shutter 1c of light irradiation unit 1 is closed.

(6) Workpiece W is placed on workpiece carrier 4 and attached, as is shown in FIG. 7.

(7) Illumination light is supplied to workpiece alignment mark partial illumination system WA1 and the workpiece mark WAM on the workpiece W is irradiated and recorded by means of image converter 5d. The image of the workpiece mark WAM recorded by means of image converter 5d is sent to image processing part 14 which identifies the workpiece mark and determines its position coordinates Q(W, YW).

Furthermore, as in the preceding embodiment, the entire surface of workpiece W can be irradiated by the nonexposure light emitted from light irradiation device 1.

(8) Arithmetic-logic unit 12 determines the position deviation of workpiece W and mask M based on stored position coordinates (XM, YM) of mask mark MAM and determined position coordinates (XW, YW) of the workpiece mark.

(9) Carrier controlling element 13, based on the above described position deviation, drives mask carrier 2 and/or workpiece carrier 4 in the X-Yθ directions to bring the position of the mask mark MAM into agreement with the position of the workpiece mark WAM.

(10) Shutter 1c of the light irradiation device 1 is opened, the exposure light is emitted onto mask M and thus exposure is performed. Furthermore, in the case in which alignment unit 5 extends into the exposure area, the alignment unit 5 is removed before exposure, as was described above.

As is described above, in this embodiment, the same action can be obtained as in the preceding embodiment, and at the same time, exposure can be performed without correcting the position of the workpiece carrier 4 after completion of positioning in the Z-axis direction by the measure by which the auxiliary imaging lens 4b and mirror 4c are disposed under workpiece carrier 4, and by which mask mark MAM is imaged on imaging surface Zo of the mask pattern.

Figure 8:
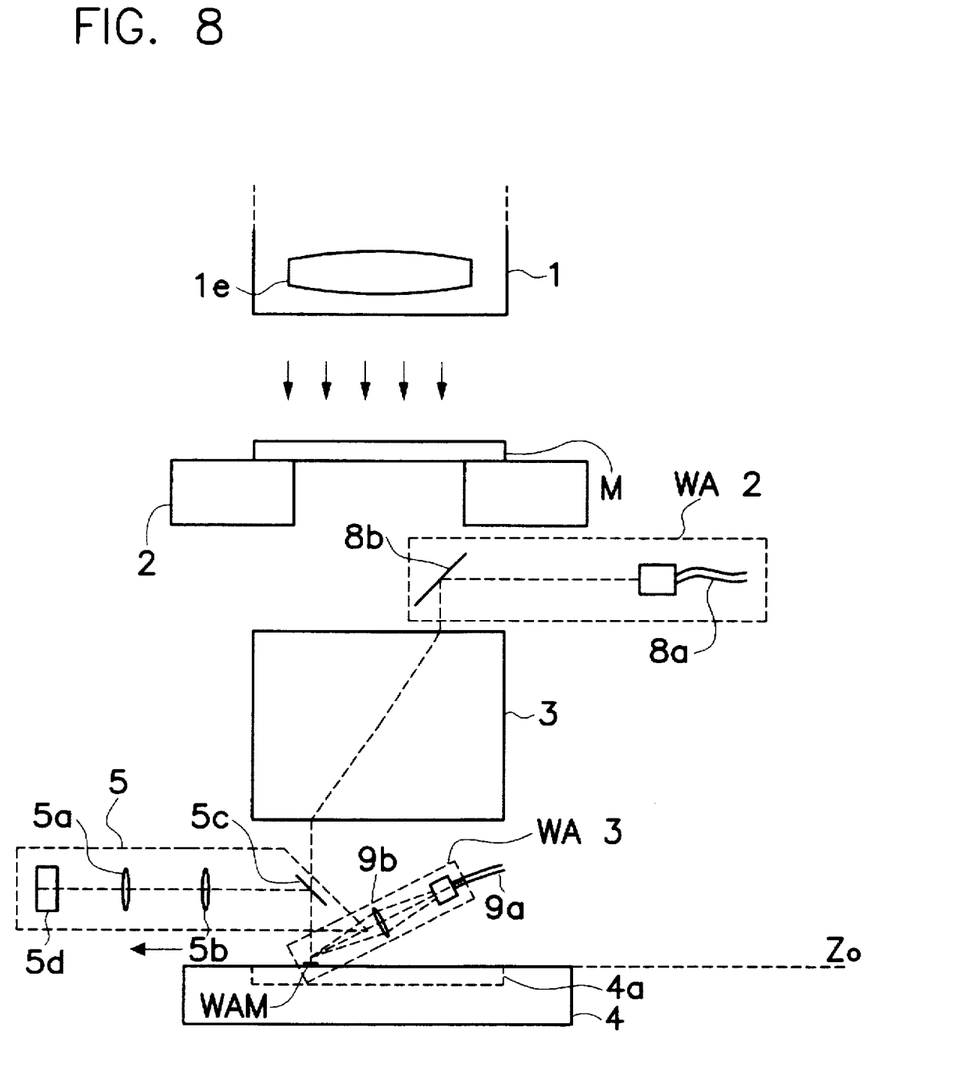
FIG. 8 shows a schematic representation of two other embodiments of the invention.

FIG. 8 schematically shows two forms that an additional embodiment of the invention may take. In the first of the forms of this embodiment of the invention, instead of workpiece alignment mark partial illumination system WA1 according to the FIG. 5 embodiment, there is a workpiece alignment mark partial illumination system WA2. In the second form of this embodiment of the invention, instead of workpiece alignment mark partial illumination system WA1 according to the FIG. 5 embodiment, there is workpiece alignment mark partial illumination system WA3. The remaining arrangement is identical to the embodiments shown in FIGS. 5, 6, and 7.

In the first form of this embodiment, as is described above, the workpiece alignment mark partial illumination system WA2 is inserted when photographing workpiece mark WAM by means of image converter 5d (step (8), above). The nonexposure light is supplied from optical fibers 8a and workpiece mark WAM on workpiece W is irradiated via mirror 8b, projection lens 3 and semitransparent mirror 5c. Other process steps are identical to the FIG. 5 embodiment.

In the second form of this embodiment, as is described above, the workpiece alignment mark partial illumination system WA3 is inserted when photographing workpiece mark WAM by means of image converter 5d (step (8), above). Nonexposure light is supplied from optical fibers 9a and the workpiece mark WAM on workpiece W is irradiated via lens 9b. Other process steps are identical to the FIG. 5 embodiment.

Figure 5:
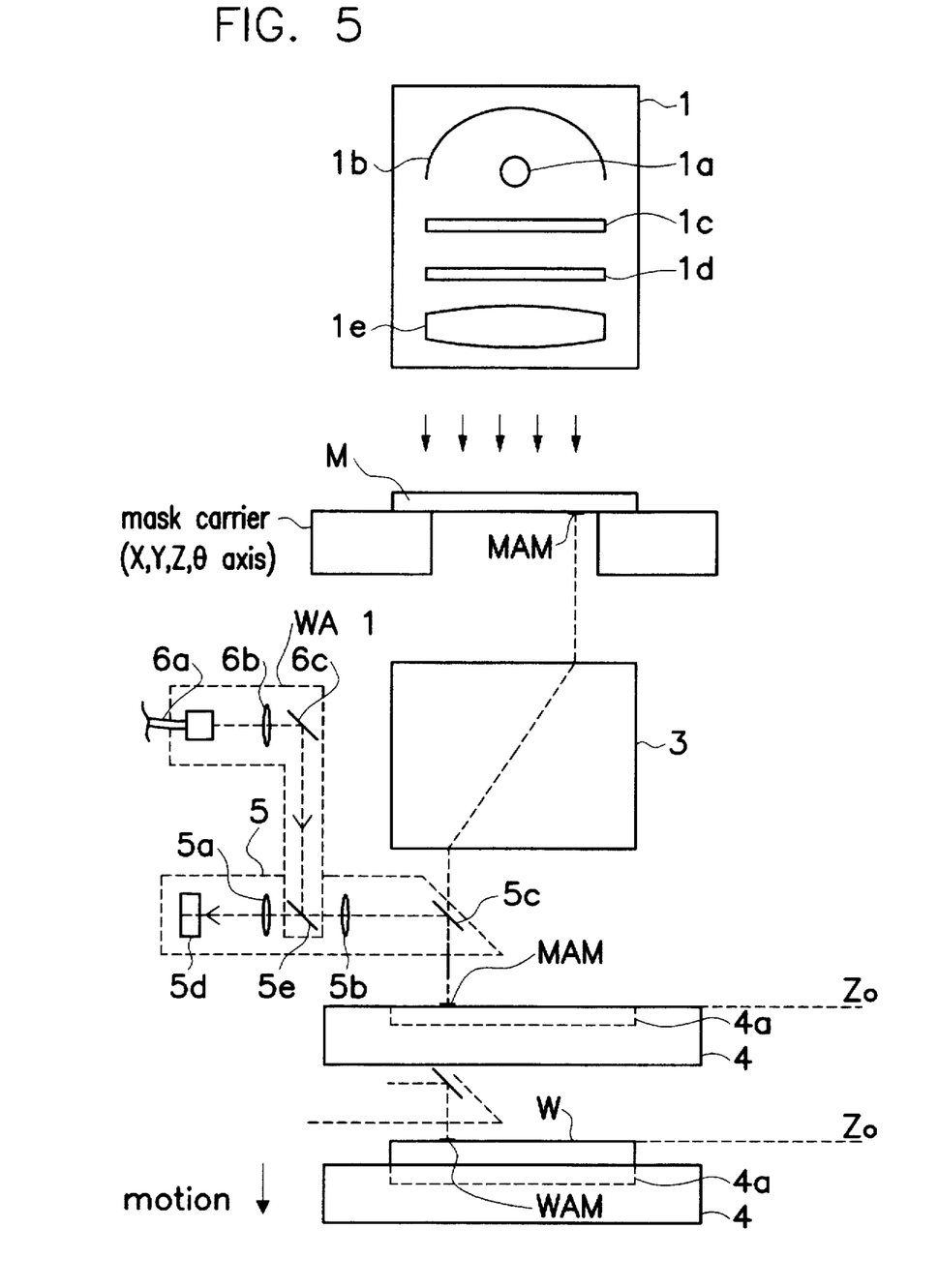
FIG. 5 shows a schematic representation of yet another embodiment of the invention.

With the first and second forms of these embodiments of the invention, as described above, the positions of the workpiece marks WAM can be reliably recognized by the arrangement of the workpiece alignment mark partial illumination systems WA2 and WA3, as in the FIG. 5 embodiment, and positioning can be done in a short time with high precision.

In the case in which alignment unit 5 and partial illumination system WA1 are integral with one another, as in the FIG. 5 embodiment, it is not necessary to adjust the position between the two. If, however, the alignment unit 5 and partial illumination system WA2 and partial illumination system WA3 are arranged as separate individual parts, as described above, it is necessary to adjust their position relative to one another, and activation is complicated as a result.

Furthermore, the above described FIG. 8 embodiments can be applied to the further embodiment (FIG. 6, 7), which can be provided with the partial illumination system WA2 or partial illumination system WA3.

In the above described further embodiments (FIGS. 5, 6 and 7), auto alignment was described in which the mask marks are automatically positioned with respect to the workpiece marks. However, the invention can also be used for manual alignment in which the operator performs positioning by moving the workpiece carrier and/or the mask carrier by observing them on the monitor display.

In the case of manual alignment in the first and second embodiments, instead of storing the position coordinates of the mask marks MAM, for example, cursers or the like are set at the positions of the mask marks displayed on the monitor, and the workpiece carrier or/and the mask carrier is moved until the displayed positions of the above described workpiece marks agree with the positions of the above described cursers.

Action of the Invention

As is described above, the workpiece marks can be determined reliably, and at the same time, promptly with positioning being achieved with high accuracy, even in the case in which a mask is used in which, by the conventional process, the area on the workpiece irradiated by the transmission light which is transmitted only according to the size of mask marks MAM becomes small, due to the measure the alignment light is emitted from the first light irradiation part onto the alignment marks of the mask, the relative positions of the alignment marks of the mask are determined/stored, then emission of the alignment light from the first light irradiation part is stopped, the alignment light is emitted onto the alignment marks of the workpiece from the second light irradiation part, the relative positions of the alignment marks of the workpiece are determined/stored, and the workpiece and/or mask are moved such that the above described two alignment marks come to rest on top of one another.

Furthermore, according to the invention, by the arrangement of the mask alignment mark partial illumination systems and by the partial illumination of the mask alignment marks, the mask marks can be projected onto the workpiece, not only by the nonexposure light, but also by the exposure light. In this way, activation for correction of the imaging error of the nonexposure light and the exposure wavelength is not longer necessary. Moreover, an application is enabled for a projection lens which has the characteristic that focussing cannot be done by the nonexposure light. In this way, positioning of the mask marks relative to the workpiece marks can be done without taking into account the characteristic of the projection lens.

In addition, in other embodiments of the invention, in which the reflection component is located in the workpiece carrier, not only can the action be obtained that, even in the case of using the mask, the workpiece marks can be determined reliably, and at the same time promptly, in which by the conventional process the area on the workpiece irradiated by the transmission light which is transmitted only according to the size of the mask marks MAM becomes small, but according to the invention the disadvantage of imaging errors of the projection lens due to the wavelength difference between the nonexposure light and the exposure light can be eliminated, so that positioning of the mask relative to the workpiece can be done with high accuracy regardless of the characteristics of the projection lens.

According to the invention, positioning can be done within a short time with high accuracy especially by the fact that the relative positions of the mask marks and the workpiece marks can be determined automatically, and at the same, time easily in the course of auto alignment.

It is to be understood that although preferred embodiments of the invention have been described, various other embodiments and variations may occur to those skilled in the art. Any such other embodiments and variations which fall within the scope and spirit of the present invention are intended to be covered by the following claims.

What I claim is:

1. Device for positioning of a mask relative to a workpiece, comprising a mask with alignment marks, a mask carrier for moving the mask, a projection lens, a workpiece with alignment marks, a workpiece carrier for moving the workpiece, a first light irradiation part for irradiation of the alignment marks of the mask with alignment light, a second light irradiation part for irradiation of the alignment marks of the workpiece with alignment light, a camera means for recording projected images of the alignment marks of the mask produced by alignment light emitted from the first light irradiation part and for recording the workpiece alignment marks illuminated by alignment light emitted from the second light irradiation part, and a control means for controlling movement of the mask carrier and the workpiece carrier as a function of video data recorded by the camera means; wherein the control means comprises means for image processing said video data, for recording, determining and storing relative positions of the mask alignment marks when alignment light is emitted from the first light irradiation part, further for recording determining and storing relative positions of the workpiece alignment marks when emission of the alignment light from the first light irradiation part stops and alignment light is emitted from the second light irradiation part, and for computing data of the relative positions of the mask and workpiece alignment marks and for producing relative movement of the workpiece and the mask via movement of at least one of said carriers on the basis of the computed data until the mask and workpiece alignment marks are aligned one on top of the other.

2. Device for positioning of a mask to a workpiece, comprising a mask having alignment marks, a mask carrier for moving the mask, a projection lens, a workpiece having alignment marks, a workpiece carrier for moving the workpiece, at least one light irradiation part for selectively emitting either of exposure light and nonexposure light as alignment light and for irradiating the alignment marks of at least one of the mask and the workpiece with said alignment light, a reflection component which is located on the workpiece carrier for imaging images of the alignment marks of the mask projected by exposure light emitted from the light irradiation part as said alignment light, a camera means for recording the projected images of the alignment marks of the mask and for recording images of the alignment marks of the workpiece illuminated by alignment light emitted from the light irradiation part, and a control means for controlling movements of the mask carrier and the workpiece carrier based on video data recorded by the camera means, said control means comprising means for recording video data of the alignment marks of the mask projected onto the reflection component, for image processing the video data, for determining and storing relative positions of the alignment marks of the mask when exposure light is emitted from the light irradiation part, for recording video data of the alignment marks of the workpiece, for image processing the video data of the alignment marks of the workpiece, for determining and storing relative positions of the alignment marks of the workpiece when the emission of exposure light from the light irradiation part stops and nonexposure light is emitted as said alignment light onto the alignment marks of the workpiece, for computing data of the relative positions of the alignment marks of the mask and workpiece relative to each other, and for moving the workpiece and the mask relative to each other via movement of at least one of the carriers on the basis of the computed data until the mask and workpiece alignment marks come to rest one on top of another.

3. Device for positioning of a mask to a workpiece according to claim 2, wherein said reflection component comprises a mirror installed on a surface of the workpiece carrier.

4. Device for positioning of a mask to a workpiece according to claim 2, wherein said reflection component comprises a mirror and an auxiliary imaging lens which are arranged as a means for producing projected images of the alignment marks of the mask on a surface position of the workpiece on the workpiece carrier.

* * * * *